United States Patent
Mizutani et al.

(10) Patent No.: US 6,819,273 B2
(45) Date of Patent: Nov. 16, 2004

(54) DIGITAL-ANALOG-CONVERSION CIRCUIT HAVING FUNCTION OF AUTOMATIC OFFSET ADJUSTMENT

(75) Inventors: Tohru Mizutani, Kawasaki (JP); Hiromi Nanba, Kawasaki (JP); Atsushi Matsuda, Kawasaki (JP); Atsushi Hitaka, Kawasaki (JP); Masashi Okubo, Kawasaki (JP); Yoshinori Yoshikawa, Kawasaki (JP); Kenichi Minobe, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/367,966

(22) Filed: Feb. 19, 2003

(65) Prior Publication Data

US 2003/0179118 A1 Sep. 25, 2003

(30) Foreign Application Priority Data

Mar. 19, 2002 (JP) ........................................ 2002-077053

(51) Int. Cl.[7] .............................................. H03M 1/10
(52) U.S. Cl. ........................................ 341/118; 341/120
(58) Field of Search .................................. 341/118, 120

(56) References Cited

U.S. PATENT DOCUMENTS 5,818,370 A * 10/1998 Sooch et al. ................ 341/120
6,362,768 B1 * 3/2002 Younis et al. ............... 341/120

FOREIGN PATENT DOCUMENTS

| JP | 5-130559 | 5/1993 |
| JP | 2000-278345 | 10/2000 |

* cited by examiner

Primary Examiner—Howard Williams
(74) Attorney, Agent, or Firm—Arent Fox

(57) ABSTRACT

An integrated circuit includes an analog signal output unit which converts a digital output signal into at least one analog output signal, and outputs the at least one analog output signal, an analog signal input unit which converts at least one analog input signal received from an exterior into a digital input signal, a switch circuit which provides at least one signal path through which the at least one analog output signal is supplied from the analog signal output unit to the analog signal input unit as the at least one analog input signal, and an offset adjustment control circuit which supplies an output offset from the analog signal output unit to the analog signal input unit via the at least one signal path so as to detect the digital input signal inclusive of the output offset and an input offset, and cancels offsets of the analog signal output unit and the analog signal input unit in response to the output offset and the input offset obtained from the detected digital input signal.

10 Claims, 17 Drawing Sheets

DIGITAL-ANALOG-CONVERSION CIRCUIT HAVING FUNCTION OF AUTOMATIC OFFSET ADJUSTMENT

CROSS-REFERENCE TO RELATED APPLICATIONS

The present application is based upon and claims the benefit of priority from prior Japanese Patent Application No. 2002-077053 filed on Mar. 19, 2002, with the Japanese Patent Office, the entire contents of which are incorporated herein by reference.

BACKGROUND OF THE INVENTION

1. Field of the Invention

The present invention generally relates to semiconductor integrated circuits provided with digital-analog-conversion circuits for converting signals between the digital form and the analog form, and particularly relates to a semiconductor integrated circuit provided with a digital-analog-conversion circuit having the function of automatic offset adjustment.

2. Description of the Related Art

In signal processing circuits such as analog-baseband LSIs, digital-analog-conversion circuits for converting signals between the digital form and the analog form may suffer an offset when converted signals deviate from a predetermined level. There is thus a need for a mechanism that automatically adjusts the offset. In related-art mechanisms for automatic offset adjustment, a transmission part for transmitting analog signals after digital-to-analog conversion is provided with an ADC (analog-to-digital converter) for measuring an offset, and a reception part for receiving analog signals with subsequent conversion from analog to digital is provided with a DAC (digital-to-analog converter) for measuring an offset. With this provision, automatic offset adjustment is performed separately in the transmission side and in the reception side.

The transmission part has an offset adjustment mechanism provided for a positive side of the differential output signals and another offset adjustment mechanism provided for a negative node of the differential output signals, thereby performing automatic offset adjustment separately. On the positive side, the DAC for digital-to-analog conversion is set to the code "128" (i.e., code at the midpoint), so that potential at the signal output node is set equal to a middle potential. This potential at the signal output node includes an offset as it deviates from a desired reference potential. The potential at the signal output node is converted into a digital code by the ADC for measuring an offset, allowing the output potential to be measured. The digital code obtained as a result of measurement is then compared with a code corresponding to the reference potential. This provides an offset code, which represents a displacement in codes that corresponds to the offset. Adjustment is made by using the offset code so as to make the offset as close to zero as possible. The same offset measurement and adjustment are performed on the negative side of the differential output signals.

On the reception side, the reference potential is applied to a reception node, and a digital code generated by the ADC for the AD conversion of signals is measured. This digital code is then compared with a reference code (e.g., 128), thereby providing an offset code. This offset code is used to adjust the offset as close to zero as possible.

In the related-art automatic offset adjustment, an ADC needs to be provided for the purpose of measuring an offset as described above. This results in an increase in circuit size and power consumption. Further, a sequence for the measurement and adjustment of an offset needs to be carried out on the reception side while another sequence for the measurement and adjustment of an offset is independently performed on the transmission side. This results in a lengthy offset adjustment.

Accordingly, there is a need for a digital-analog-conversion circuit which can automatically adjust an offset through a short sequence while avoiding an increase in circuit size dedicated for automatic offset adjustment as much as possible.

SUMMARY OF THE INVENTION

It is a general object of the present invention to provide a digital-analog-conversion circuit that substantially obviates one or more of the problems caused by the limitations and disadvantages of the related art.

Features and advantages of the present invention will be set forth in the description which follows, and in part will become apparent from the description and the accompanying drawings, or may be learned by practice of the invention according to the teachings provided in the description. Objects as well as other features and advantages of the present invention will be realized and attained by a digital-analog-conversion circuit particularly pointed out in the specification in such full, clear, concise, and exact terms as to enable a person having ordinary skill in the art to practice the invention.

To achieve these and other advantages and in accordance with the purpose of the invention, as embodied and broadly described herein, the invention provides an integrated circuit, including an analog signal output unit which converts a digital output signal into at least one analog output signal, and outputs the at least one analog output signal, an analog signal input unit which converts at least one analog input signal received from an exterior into a digital input signal, a switch circuit which provides at least one signal path through which the at least one analog output signal is supplied from the analog signal output unit to the analog signal input unit as the at least one analog input signal, and an offset adjustment control circuit which supplies an output offset from the analog signal output unit to the analog signal input unit via the at least one signal path so as to detect the digital input signal inclusive of the output offset and an input offset, and cancels offsets of the analog signal output unit and the analog signal input unit in response to the output offset and the input offset obtained from the detected digital input signal.

In the digital-analog-conversion circuit described above, signal paths are established between the analog signal output unit and the analog signal input unit, allowing the outputs of the analog signal output unit to be converted into a digital signal by the analog signal input unit, which makes it possible to measure an output offset and an input offset simultaneously. This measurement is repeated with varying conditions, so as to separate the measurement of the output offset from the measurement of the input offset. An offset can thus be adjusted properly in the analog signal output unit and the analog signal input unit.

Other objects and further features of the present invention will be apparent from the following detailed description when read in conjunction with the accompanying drawings.

DESCRIPTION OF THE PREFERRED EMBODIMENTS

In the following, embodiments of the present invention will be described with reference to the accompanying drawings.

Figure 1:
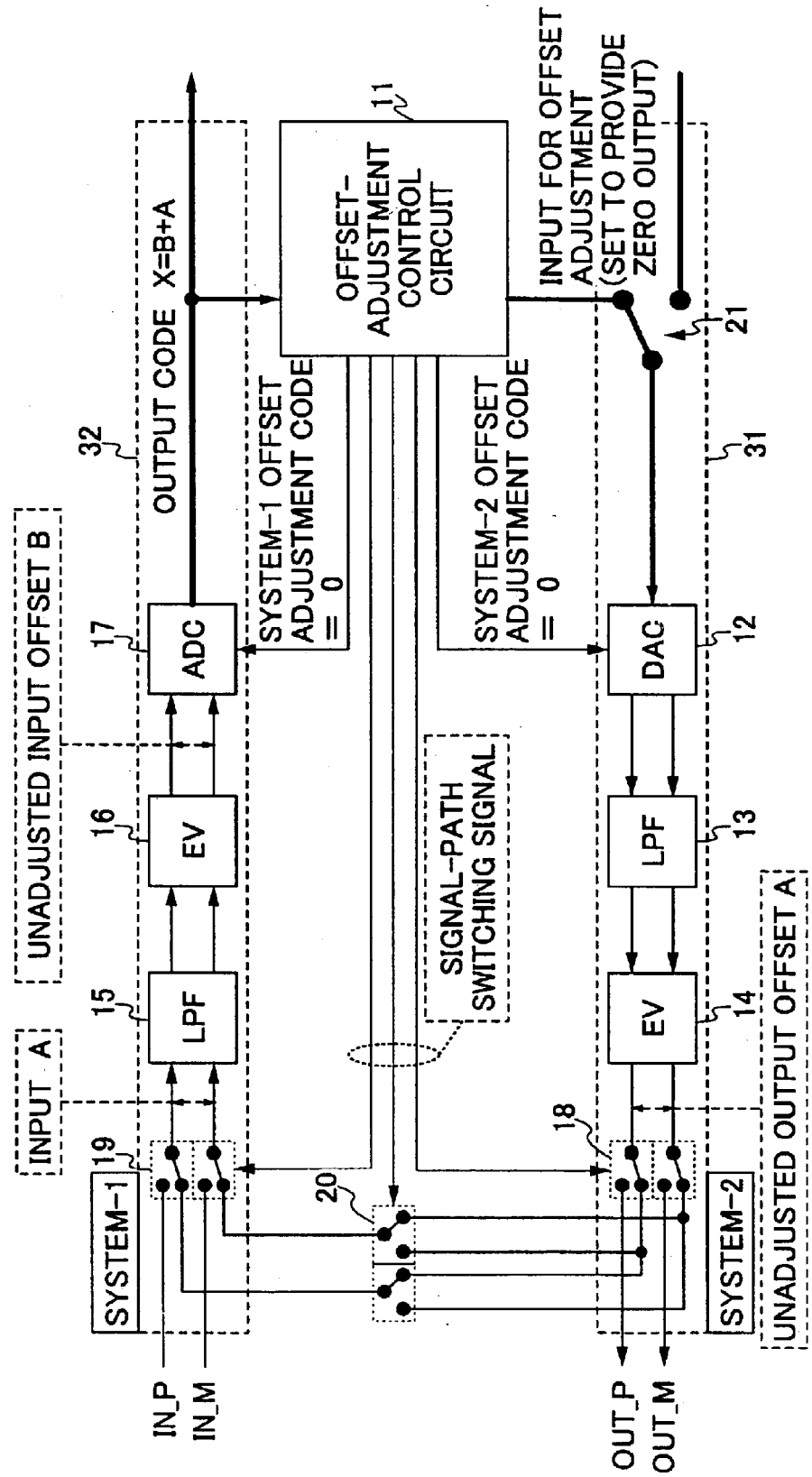
FIG. 1 is a block diagram showing a first embodiment of a digital-analog-conversion circuit according to the present invention, illustrating a first stage of an automatic offset adjustment sequence.
Figure 2:
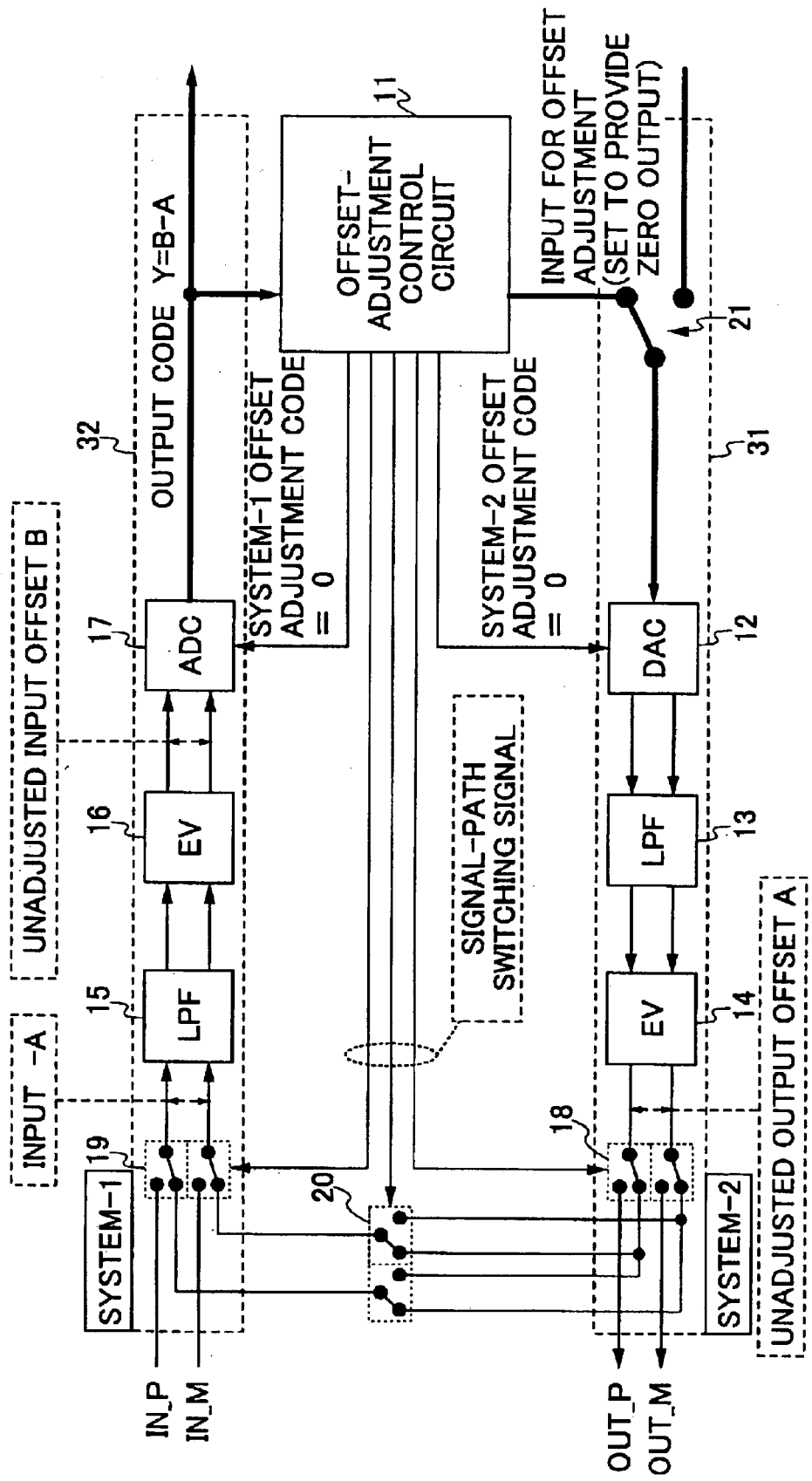
FIG. 2 is a block diagram showing the first embodiment of the digital-analog-conversion circuit, illustrating a second stage of the automatic offset adjustment sequence.
Figure 3:
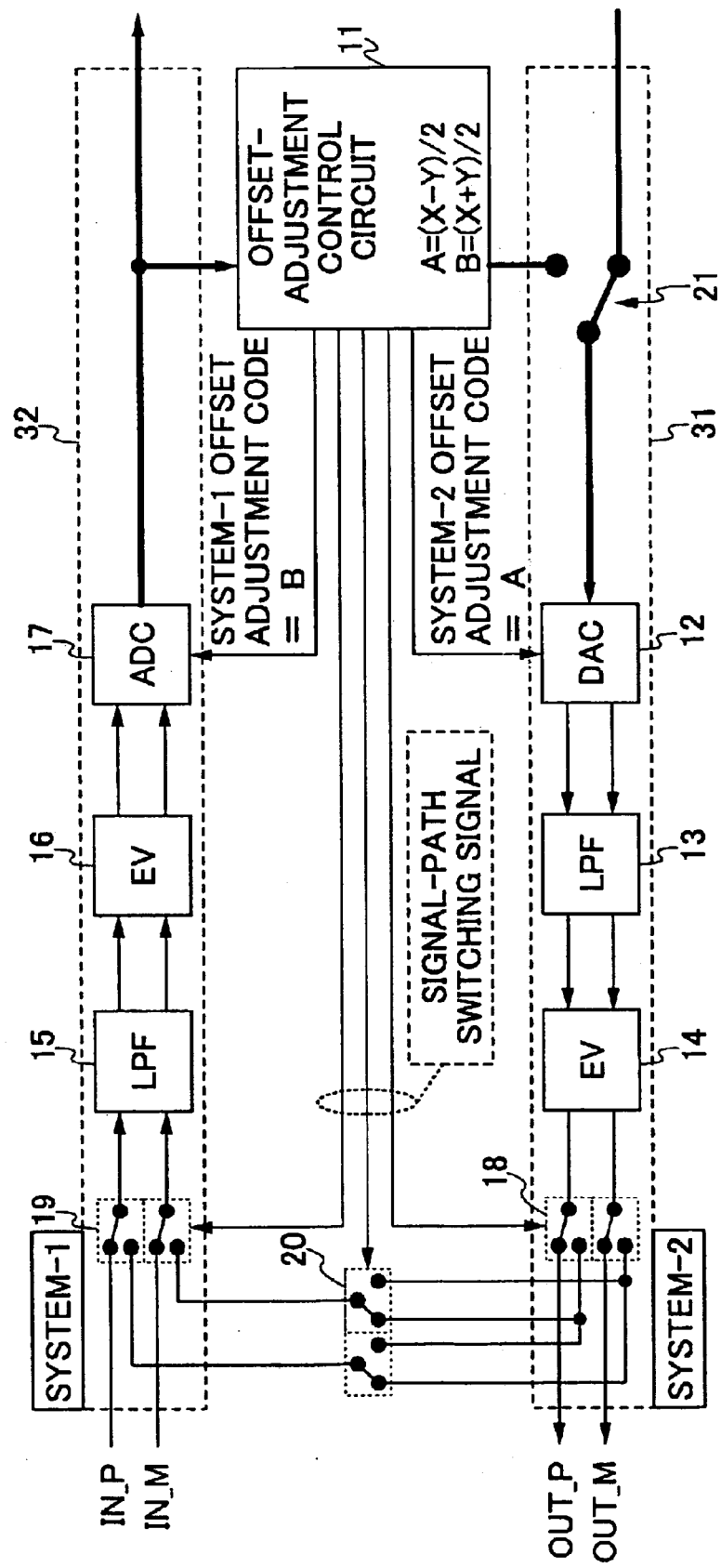
FIG. 3 is a block diagram showing the first embodiment of the digital-analog-conversion circuit, illustrating a state after the automatic offset adjustment sequence is completed.

FIG. 1 through FIG. 3 are block diagrams showing a first embodiment of a digital-analog-conversion circuit according to the present invention.

As shown in FIG. 1, the digital-analog-conversion circuit according to the present invention includes an offset-adjustment control circuit 11, a DAC 12, a low-pass filter (LPF) 13, an electronic volume (EV) 14, a low-pass filter (LPF) 15, an electronic volume (EV) 16, an ADC 17, and switch circuits 18 through 21. The DAC 12, the low-pass filter 13, the electronic volume 14, etc., together constitute an analog output unit 31, which outputs differential output signals OUT_P and OUT_M after converting digital signals into analog signals. The low-pass filter 15, the electronic volume 16, and the ADC 17 etc., together constitute an analog input unit 32, which outputs a digital signal after converting differential input signals IN_P and IN_M from the analog form to the digital form. When the circuit of FIG. 1 is used in received signal processing circuitry, the analog output unit 31 corresponds to a transmission part, and the analog input unit 32 corresponds to a reception part.

The offset-adjustment control circuit 11 adjusts an offset by providing an offset adjustment code to the DAC 12 and the ADC 17. The offset-adjustment control circuit 11 further supplies signal-path switching signals to the switch circuits 18 through 20, thereby controlling the switching of the switch circuits 18 through 20. The offset-adjustment control circuit 11 has a node that is coupled to the DAC 12 via the switch circuit 21 at the time of automatic offset adjustment. The switch circuit 18 includes a positive-side switch and a negative-side switch corresponding to the differential output signals OUT_P and OUT_M, respectively. The switch circuit 19 includes a positive-side switch and a negative-side switch corresponding to the differential input signals IN_P and IN_M, respectively. These switch circuits may be analog switches comprised of transfer gates, each of which is comprised of a PMOS transistor and an NMOS transistor connected in parallel.

FIG. 1 shows a first stage of the automatic offset adjustment sequence. FIG. 2 shows a second stage of the automatic offset adjustment sequence, and FIG. 3 shows a state after the automatic offset adjustment sequence is completed.

As shown in FIG. 1, the offset-adjustment control circuit 11 controls the switching of the switch circuit 18 so as to couple the positive-side and negative-side outputs of the electronic volume 14 to the switch circuit 20. Further, the offset-adjustment control circuit 11 controls the switching of the switch circuit 20 so as to couple the output of the positive-side switch of the switch circuit 18 to the positive-side switch of the switch circuit 19 and to couple the output of the negative-side switch of the switch circuit 18 to the negative-side switch of the switch circuit 19. Moreover, the offset-adjustment control circuit 11 controls the switching of the switch circuit 19 so as to couple the signals received from the switch circuit 20 to the low-pass filter 15. In this manner, the positive-side output of the analog output unit 31 is input into the positive side of the analog input unit 32, and the negative-side output of the analog output unit 31 is input into the negative side of the analog input unit 32.

The offset-adjustment control circuit 11 supplies a zero potential to the DAC 12 via the switch circuit 21. This zero potential goes through the DAC 12, the low-pass filter 13, and the electronic volume 14 to appear as an unadjusted output offset A between the positive and negative nodes of the electronic volume 14. At this time, offset adjustment codes supplied from the offset-adjustment control circuit 11 to the DAC 12 and the ADC 17 are set to zero.

The unadjusted output offset A is input into the low-pass filter 15 without any change. An unadjusted input offset B of the low-pass filter 15 and the electronic volume 16 is added to the unadjusted output offset A. As a result, an output code X output from the ADC 17 is equal to B+A that is a sum of the unadjusted output offset A and the unadjusted input offset B.

As shown in FIG. 2, thereafter, the offset-adjustment control circuit 11 controls the switching of the switch circuit 18 so as to couple the positive-side and negative-side outputs of the electronic volume 14 to the switch circuit 20. Further, the offset-adjustment control circuit 11 controls the switching of the switch circuit 20 so as to couple the output of the positive-side switch of the switch circuit 18 to the negative-side switch of the switch circuit 19 and to couple the output of the negative-side switch of the switch circuit 18 to the positive-side switch of the switch circuit 19. Moreover, the offset-adjustment control circuit 11 controls the switching of the switch circuit 19 so as to couple the signals received from the switch circuit 20 to the low-pass filter 15. In this manner, the positive-side output of the analog output unit 31 is input into the negative side of the analog input unit 32, and the negative-side output of the analog output unit 31 is input into the positive side of the analog input unit 32.

In this case, the unadjusted output offset A is inverted and input as "−A" into the low-pass filter 15. The unadjusted input offset B of the low-pass filter 15 and the electronic volume 16 is added to the inverse (−A) of the unadjusted output offset A. As a result, an output code Y output from the ADC 17 is equal to B−A that is a sum of the inverse (−A) of the unadjusted output offset A and the unadjusted input offset B.

Based on the output codes X and Y obtained in the manner as described above, the offset-adjustment control circuit 11 obtains the unadjusted output offset A and the unadjusted input offset B as follows:

$A=(X-Y)/2$; and $B=(X+Y)/2$.

As shown in FIG. 3, the offset-adjustment control circuit 11 supplies A as an offset adjustment code to the DAC 12 to cancel the output offset, and supplies B as an offset adjustment code to the ADC 17 to cancel the input offset. At this time, the switch circuit 21 disconnects the offset-adjustment control circuit 11 from the DAC 12, and couples a digital signal received from an exterior to the DAC 12. The offset-adjustment control circuit 11 controls the switch circuit 18 so as to establish paths through which the outputs of the electronic volume 14 are transmitted as the differential output signals OUT_P and OUT_M from the analog output unit 31. Further, the offset-adjustment control circuit 11 controls the switch circuit 19 to establish paths through which the differential input signals IN_P and IN_M input into the analog input unit 32 are supplied to the low-pass filter 15. With these settings, the analog output unit 31 outputs analog signals having an offset thereof adjusted, and the digital signal produced though conversion by the analog input unit 32 has an offset thereof being adjusted.

In the present invention as described above, signal paths are established between the analog output unit 31 and the analog input unit 32, allowing the outputs of the analog output unit 31 to be converted into digital signals by the analog input unit 32, which makes it possible to measure an output offset and an input offset simultaneously. This measurement is repeated with varying conditions, so as to separate the measurement of the output offset from the measurement of the input offset. Each offset can thus be adjusted properly.

Figure 4:
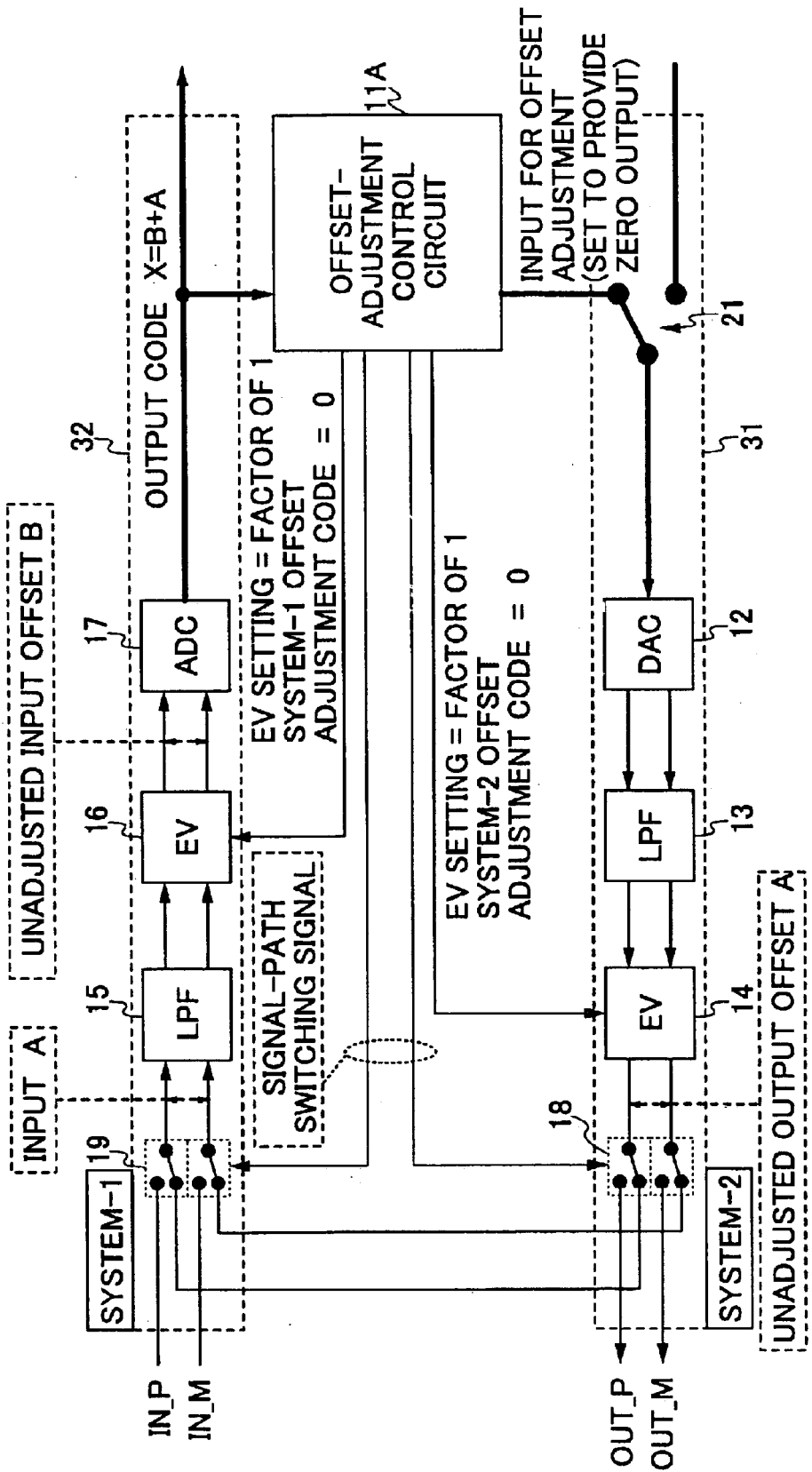
FIG. 4 is a block diagram showing a second embodiment of the digital-analog-conversion circuit according to the present invention, illustrating a first stage of an automatic offset adjustment sequence.
Figure 5:
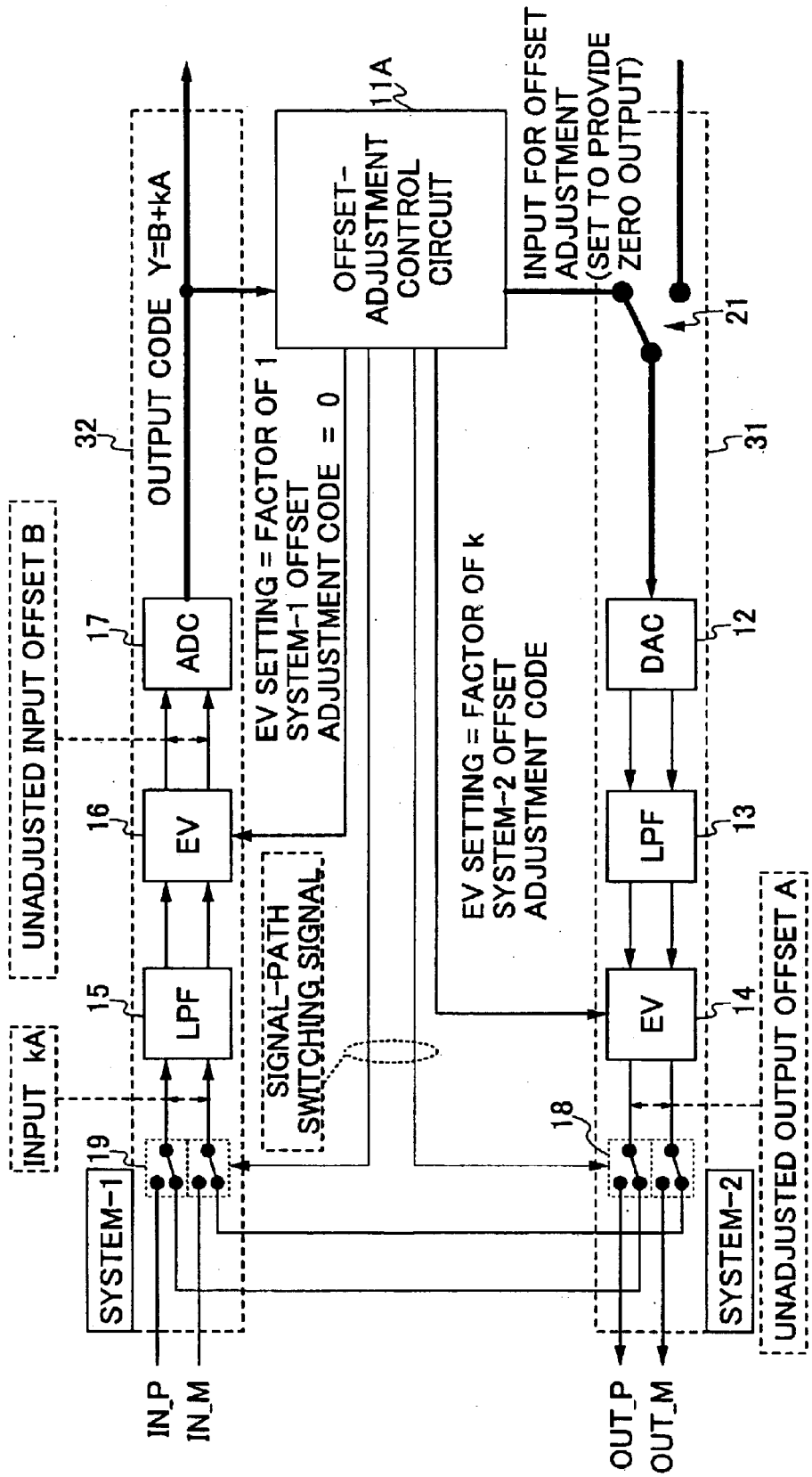
FIG. 5 is a block diagram showing the second embodiment of the digital-analog-conversion circuit, illustrating a second stage of the automatic offset adjustment sequence.
Figure 6:
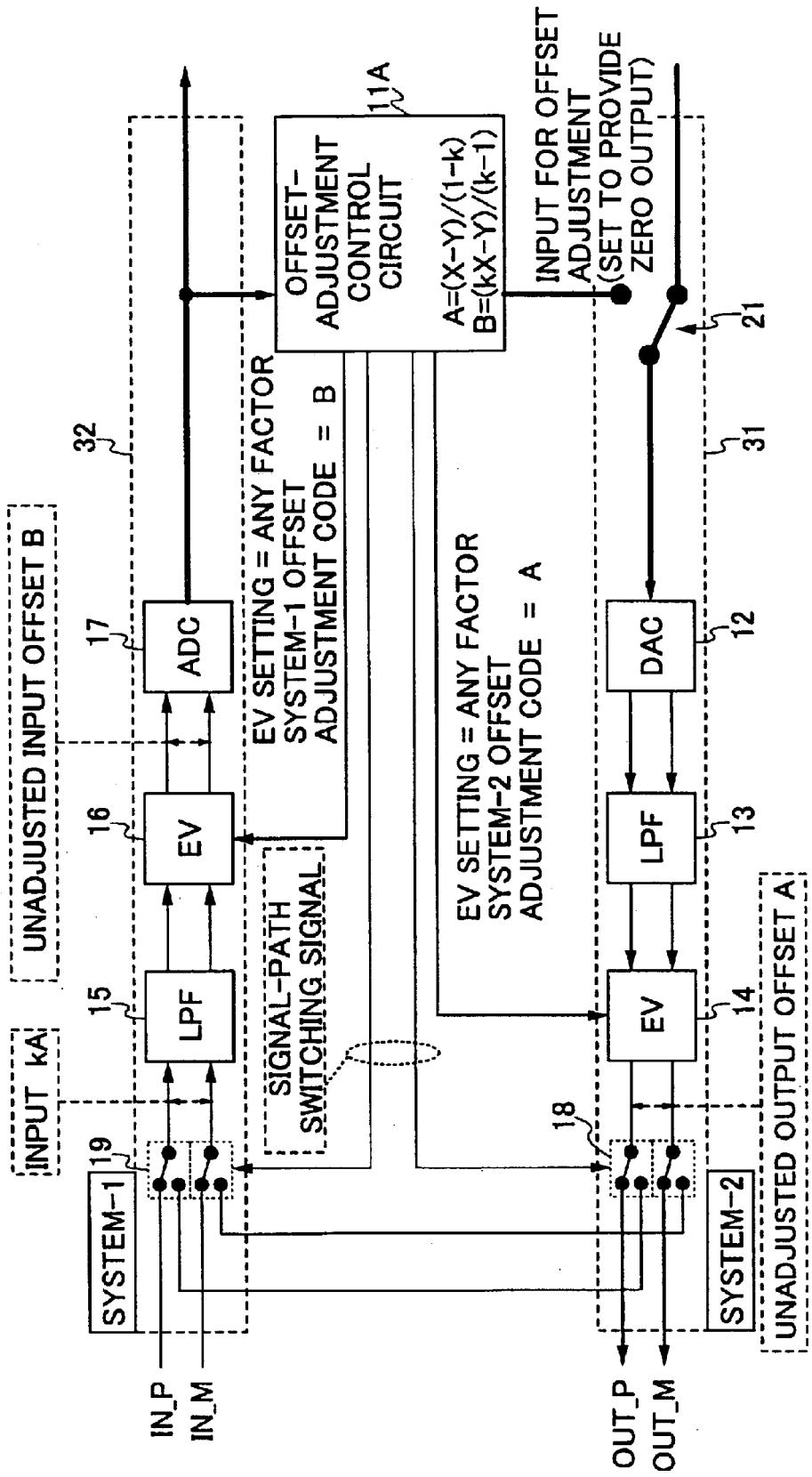
FIG. 6 is a block diagram showing the second embodiment of the digital-analog-conversion circuit, illustrating a state after the automatic offset adjustment sequence is completed.

FIG. 4 through FIG. 6 are block diagrams showing a second embodiment of a digital-analog-conversion circuit according to the present invention. In FIG. 4 through FIG. 6, the same elements as those of FIG. 1 through FIG. 3 are referred to by the same numerals, and a description thereof will be omitted.

As shown in FIG. 4, the digital-analog-conversion circuit of the second embodiment is provided with an offset-adjustment control circuit 11A, which replaces the offset-adjustment control circuit 11 of the first embodiment. The offset-adjustment control circuit 11A adjusts offsets by supplying offset adjustment codes to the electronic volume 14 and the electronic volume 16. The offset-adjustment control circuit 11A further supplies signal-path switching signals to the switch circuits 18 and 19, thereby controlling the switching of the switch circuits 18 and 19. The offset-adjustment control circuit 11A has a node that is coupled to the DAC 12 via the switch circuit 21 at the time of automatic offset adjustment.

FIG. 4 shows a first stage of the automatic offset adjustment sequence. FIG. 5 shows a second stage of the automatic offset adjustment sequence, and FIG. 6 shows a state after the automatic offset adjustment sequence is completed.

As shown in FIG. 4, the offset-adjustment control circuit 11A controls the switching of the switch circuit 18 so as to couple the positive-side output of the electronic volume 14 to the positive switch of the switch circuit 19 and to couple the negative-side output of the electronic volume 14 to the negative switch of the switch circuit 19. Further, the offset-adjustment control circuit 11A controls the switching of the switch circuit 19 so as to couple the signals received from the switch circuit 18 to the low-pass filter 15. In this manner, the positive-side output of the analog output unit 31 is input into the positive side of the analog input unit 32, and the negative-side output of the analog output unit 31 is input into the negative side of the analog input unit 32.

At this time, the offset-adjustment control circuit 11A sets the amplification factors of the electronic volumes 14 and 16 to "1". Further, offset adjustment codes supplied from the offset-adjustment control circuit 11A to the electronic volumes 14 and 16 are set to zero.

The unadjusted output offset A output from the electronic volume 14 is input into the low-pass filter 15 without any change. The unadjusted input offset B of the low-pass filter 15 and the electronic volume 16 is added to the unadjusted output offset A. As a result, an output code X output from the ADC 17 is equal to B+A that is a sum of the unadjusted output offset A and the unadjusted input offset B.

As shown in FIG. 5, thereafter, the offset-adjustment control circuit 11A sets the amplification factor of the electronic volume 14 to k while maintaining the switching of the switch circuits 18 and 19 as shown in FIG. 4. In this case, the unadjusted output offset at the output of the electronic volume 14 is kA, which is supplied to the low-pass filter 15. The unadjusted input offset B of the low-pass filter 15 and the electronic volume 16 is added to the unadjusted output offset kA. As a result, an output code Y output from the ADC 17 is equal to B+kA.

Based on the output codes X and Y obtained in the manner as described above, the offset-adjustment control circuit 11A obtains the unadjusted output offset A and the unadjusted input offset B as follows:

$A=(X-Y)/(1-k)$; and $B=(kX-Y)/(k-1)$.

As shown in FIG. 6, the offset-adjustment control circuit 11A supplies A as an offset adjustment code to the electronic volume 14 to cancel the output offset, and supplies B as an offset adjustment code to the electronic volume 16 to cancel the input offset. Further, the offset-adjustment control circuit 11A controls the switch circuits 18, 19, and 21 so as to establish signal paths that are used after the completion of the automatic offset adjustment. With these settings, the analog output unit 31 outputs analog signals having an offset thereof adjusted, and the digital signal produced though conversion by the analog input unit 32 has an offset thereof being adjusted.

In the present invention as described above, signal paths are established between the analog output unit 31 and the analog input unit 32, allowing the outputs of the analog output unit 31 to be converted into digital signals by the analog input unit 32, which makes it possible to measure an output offset and an input offset simultaneously. This measurement is repeated with varying conditions, so as to separate the measurement of the output offset from the measurement of the input offset. Each offset can thus be adjusted properly.

In the second embodiment described above, offset adjustment codes are supplied to the electronic volumes to cancel offsets. Alternatively, provision may be made in the same manner as in the first embodiment so as to cancel offsets by supplying offset adjustment codes to the DAC and ADC. Conversely, the first embodiment may be configured in such a manner that offset adjustment codes may be supplied to the electronic volumes to cancel offsets. In the first and second embodiments, a DAC and an operation amplifier may additionally be provided in the analog output unit 31, and offset adjustment codes may be converted into analog signals by the DAC, which are then supplied to the operation amplifier, which cancels offsets of the output signals. The present invention is not limited to particular configurations with respect to the cancellation of offsets based on offset adjustment codes.

FIG. 7 through FIG. 10 are block diagrams showing a third embodiment of the digital-analog-conversion circuit according to the present invention. In FIG. 7 through FIG. 10, the same elements as those of FIG. 1 through FIG. 3 are referred to by the same numerals, and a description thereof will be omitted.

The digital-analog-conversion circuit of the third embodiment is provided with switch circuits 22 and 23 in place of the switch circuit 20 of the first embodiment, and is also provided with an offset-adjustment control circuit 11B, which replaces the offset-adjustment control circuit 11 of the first embodiment. In contrast with the first and second embodiments in which only a reverse phase offset is factored in between the positive side and the negative side, the third embodiment takes into account an in-phase offset in addition to the reverse phase offset.

Figure 7:
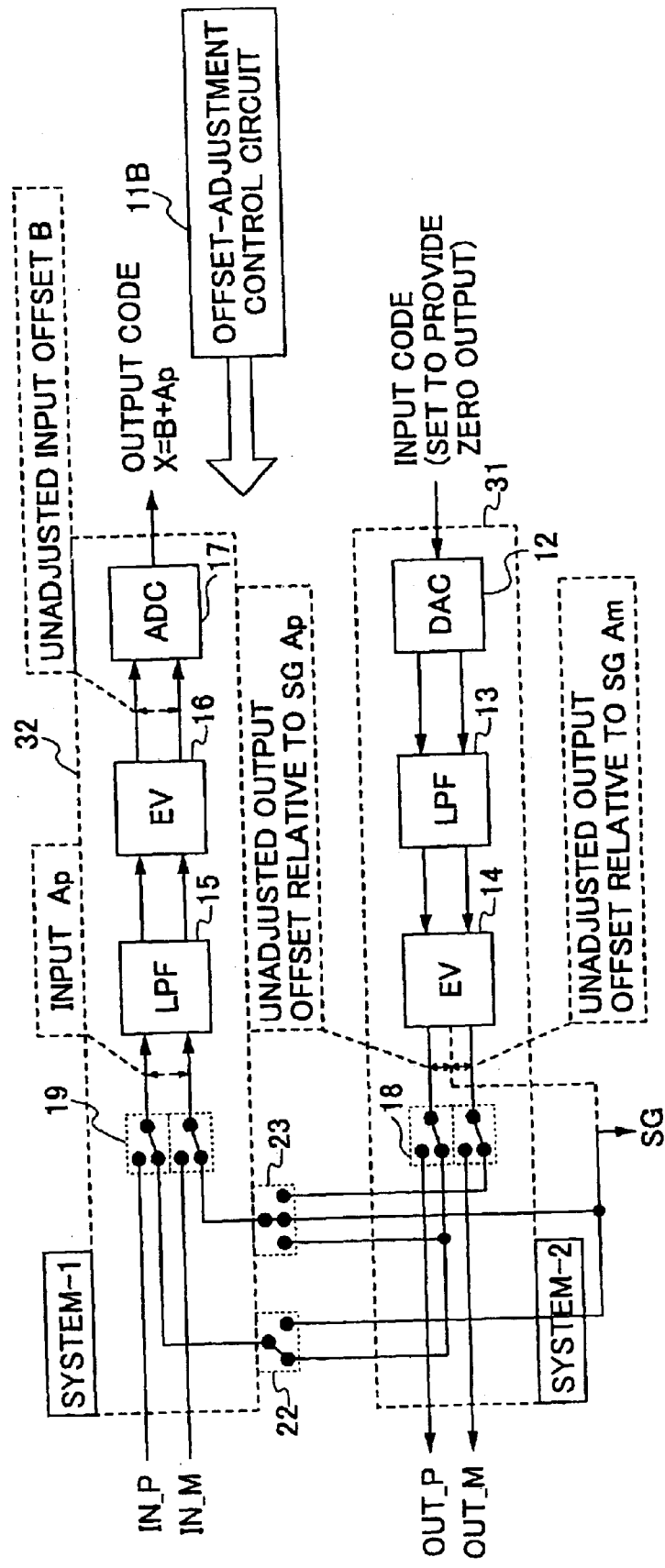
FIG. 7 is a block diagram showing a third embodiment of the digital-analog-conversion circuit according to the present invention, illustrating a first stage of an automatic offset adjustment sequence.

As shown in FIG. 7, the offset-adjustment control circuit 11B controls the switching of the switch circuit 18 so as to couple the positive-side output of the electronic volume 14 to the switch circuit 22 and to couple the negative-side output of the electronic volume 14 to the switch circuit 23. Further, the offset-adjustment control circuit 11B controls the switching of the switch circuit 22 so as to couple the output of the positive-side switch of the switch circuit 18 to the positive-side switch of the switch circuit 19, and controls the switching of the switch circuit 23 to couple a signal ground SG to the negative-side switch of the switch circuit 19. Moreover, the offset-adjustment control circuit 11B controls the switching of the switch circuit 19 so as to couple the signals received from the switch circuits 22 and 23 to the low-pass filter 15. In this manner, the positive-side output of the analog output unit 31 is input into the positive side of the analog input unit 32, and the signal ground SG is input into the negative side of the analog input unit 32. Here, the signal ground SG is a center potential of the differential signals. The differential signals vary with predetermined amplitude on the positive side and negative side of the signal ground SG serving as the center potential.

The offset-adjustment control circuit 11B supplies a zero potential to the DAC 12. In response, certain potentials appear at the outputs of the electronic volume 14. At the outputs of the electronic volume 14, an offset of the positive-side signal relative to the signal ground SG is denoted as a positive-side unadjusted output offset Ap, and an offset of the negative-side signal relative to the signal ground SG is denoted as a negative-side unadjusted output offset Am.

The positive-side input of the low-pass filter 15 receives the positive-side output of the electronic volume 14, and the negative-side input of the low-pass filter 15 receives the signal ground SG. Namely, the positive-side unadjusted output offset Ap appears as a differential offset at the inputs of the low-pass filter 15. The unadjusted input offset B of the low-pass filter 15 and the electronic volume 16 is added to the positive-side unadjusted output offset Ap. As a result, an output code X output from the ADC 17 is equal to B+Ap that is a sum of the positive-side unadjusted output offset Ap and the unadjusted input offset B.

Figure 8:
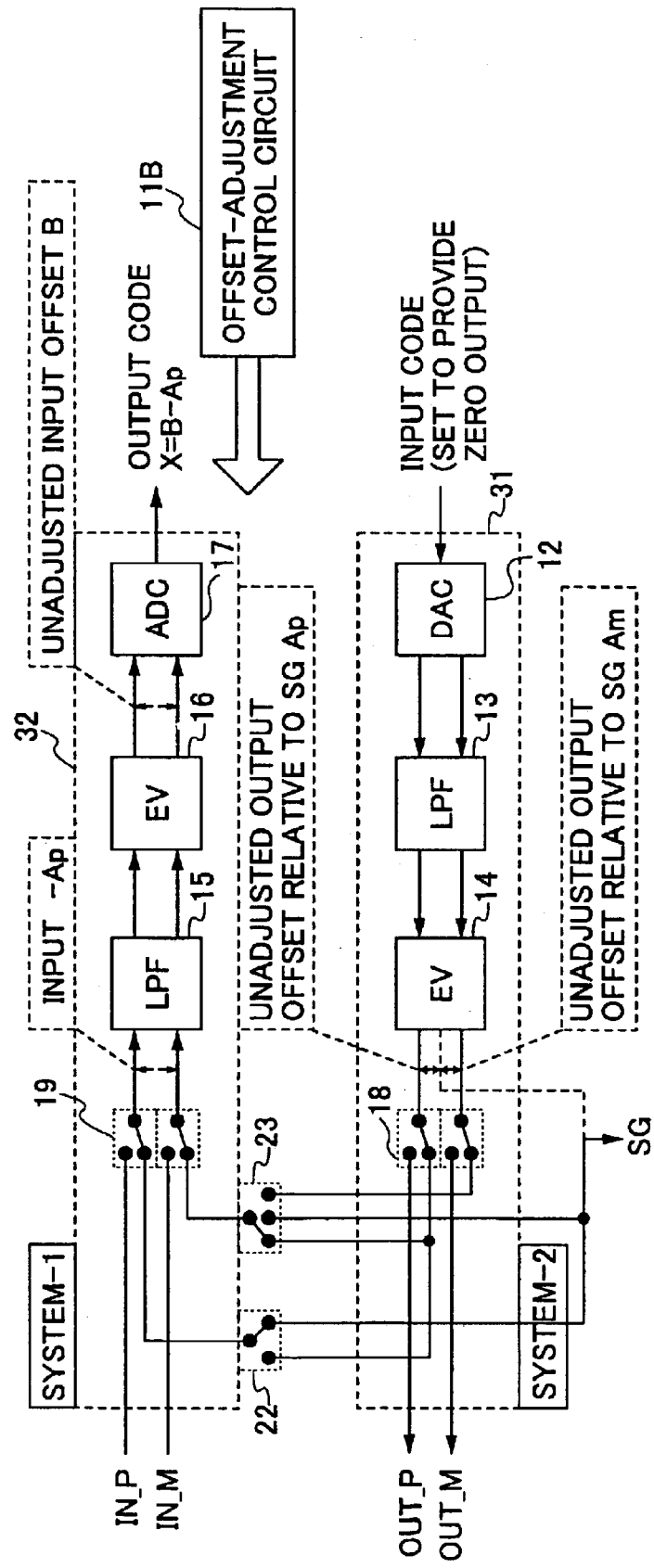
FIG. 8 is a block diagram showing the third embodiment of the digital-analog-conversion circuit, illustrating a second stage of the automatic offset adjustment sequence.

As shown in FIG. 8, thereafter, the offset-adjustment control circuit 11B controls the switching of the switch circuits 18, 19, 22 and 23 so as to couple the positive-side output of the analog output unit 31 to the negative side of the analog input unit 32 and to couple the signal ground SG to the positive side of the analog input unit 32. As a result, an inverse −Ap of the positive-side unadjusted output offset (Ap) appears as a differential offset at the inputs of the low-pass filter 15. The unadjusted input offset B of the low-pass filter 15 and the electronic volume 16 is added to the inverse −Ap of the positive-side unadjusted output offset. As a result, an output code Y output from the ADC 17 is equal to B−Ap.

Figure 9:
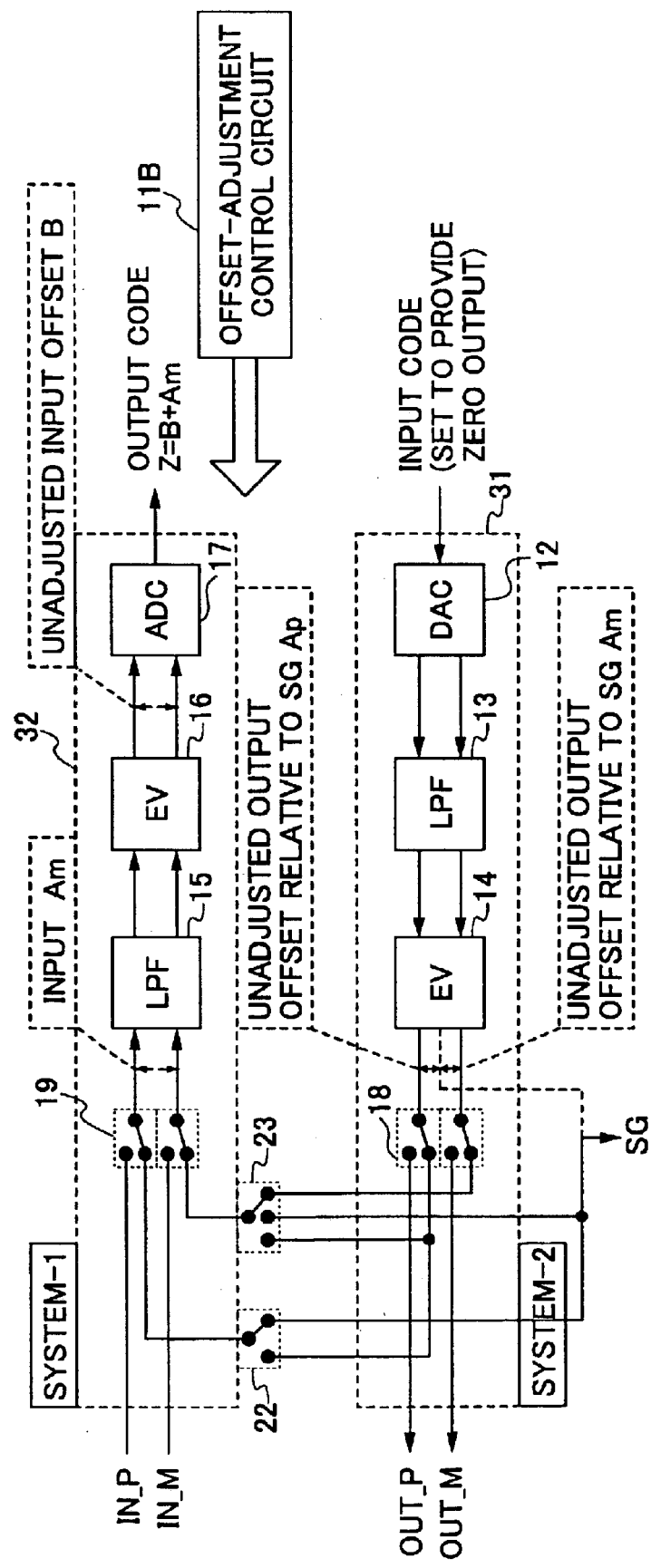
FIG. 9 is a block diagram showing the third embodiment of the digital-analog-conversion circuit, illustrating a third stage of the automatic offset adjustment sequence.

Further as shown in FIG. 9, the offset-adjustment control circuit 11B controls the switching of the switch circuits 18, 19, 22 and 23 so as to couple the negative-side output of the analog output unit 31 to the negative side of the analog input unit 32 and to couple the signal ground SG to the positive side of the analog input unit 32. As a result, the negative-side unadjusted output offset Am appears as a differential offset at the inputs of the low-pass filter 15. The unadjusted input offset B of the low-pass filter 15 and the electronic volume 16 is added to the negative-side unadjusted output offset Am. As a result, an output code Z output from the ADC 17 is equal to B+Am.

Based on the output codes X, Y, and Z obtained in the manner as described above, the offset-adjustment control circuit 11B obtains the positive-side unadjusted output offset Ap, the negative-side unadjusted output offset Am, and the unadjusted input offset B as follows:

$$Ap=(X-Y)/2;$$

$$Am=Z-(X+Y)/2;$$

$$B=(X+Y)/2.$$

Figure 10:
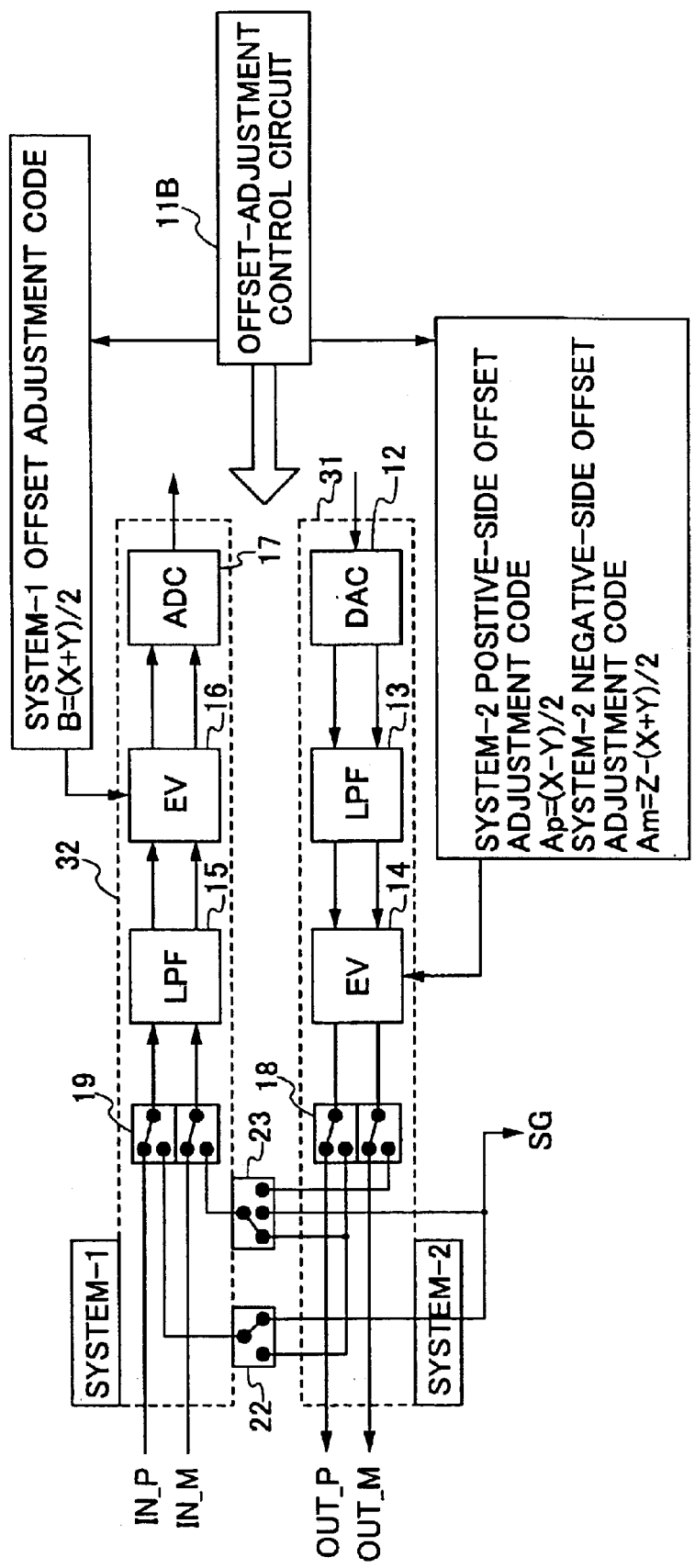
FIG. 10 is a block diagram showing the third embodiment of the digital-analog-conversion circuit, illustrating a state after the automatic offset adjustment sequence is completed.

As shown in FIG. 10, the offset-adjustment control circuit 11B supplies Ap and Am as positive-side and negative-side offset adjustment codes to the electronic volume 14 to cancel the output offset, and supplies B as an offset adjustment code to the electronic volume 16 to cancel the input offset.

Further, the offset-adjustment control circuit 11B controls the switch circuits 18 and 19 so as to establish signal paths that are used after the completion of the automatic offset adjustment. With these settings, the analog output unit 31 outputs analog signals having offsets thereof adjusted, and the digital signal produced though conversion by the analog input unit 32 has an offset thereof being adjusted.

In the third embodiment described above, the positive-side offset and the negative-side offset are obtained separately from each other, thereby making it possible to achieve offset adjustment that takes into account not only a reverse phase offset but also an in-phase offset. This helps to produce more accurate signal levels.

Figure 11:
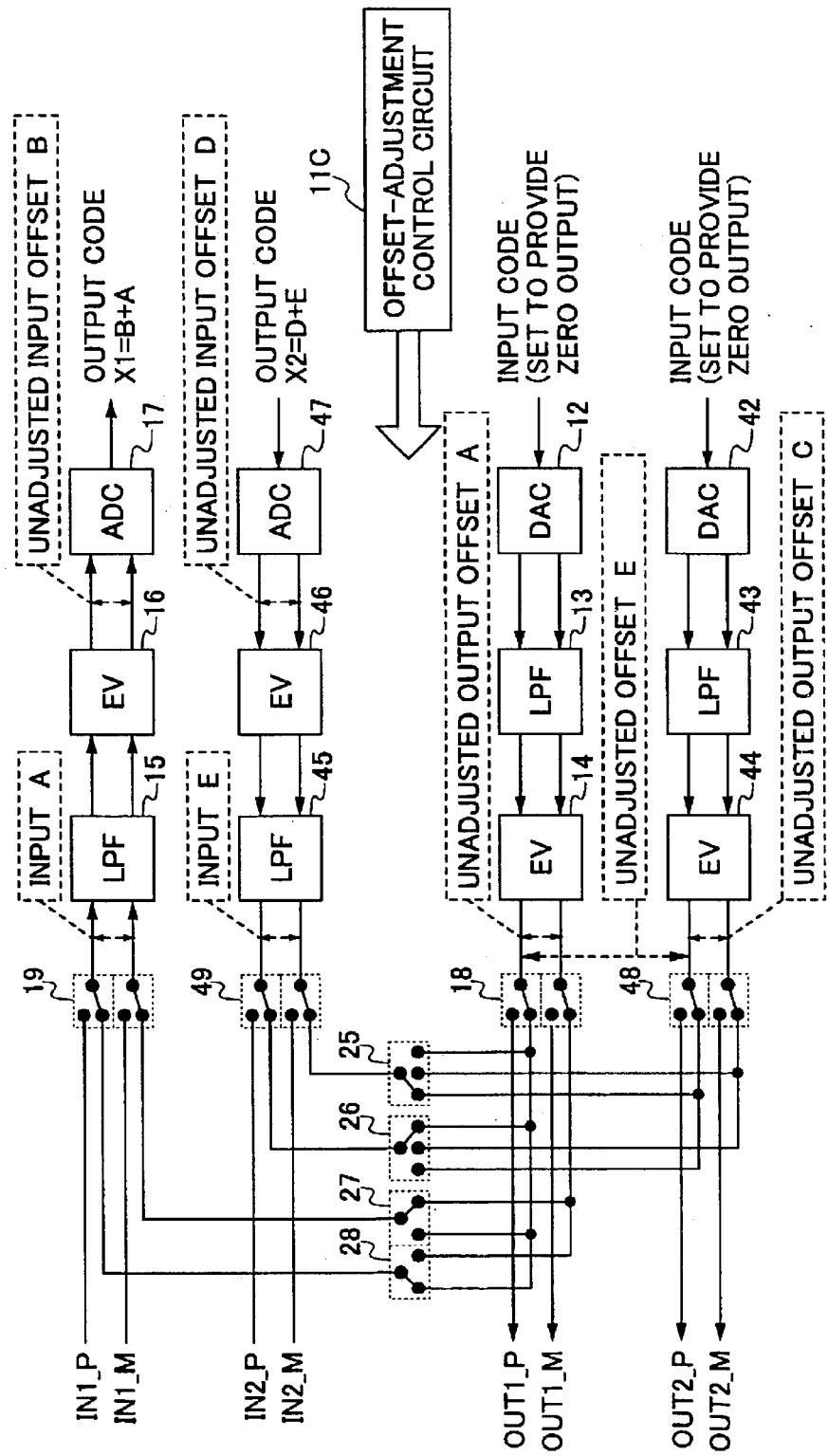
FIG. 11 is a block diagram showing a fourth embodiment of the digital-analog-conversion circuit according to the present invention, illustrating a first stage of an automatic offset adjustment sequence.
Figure 12:
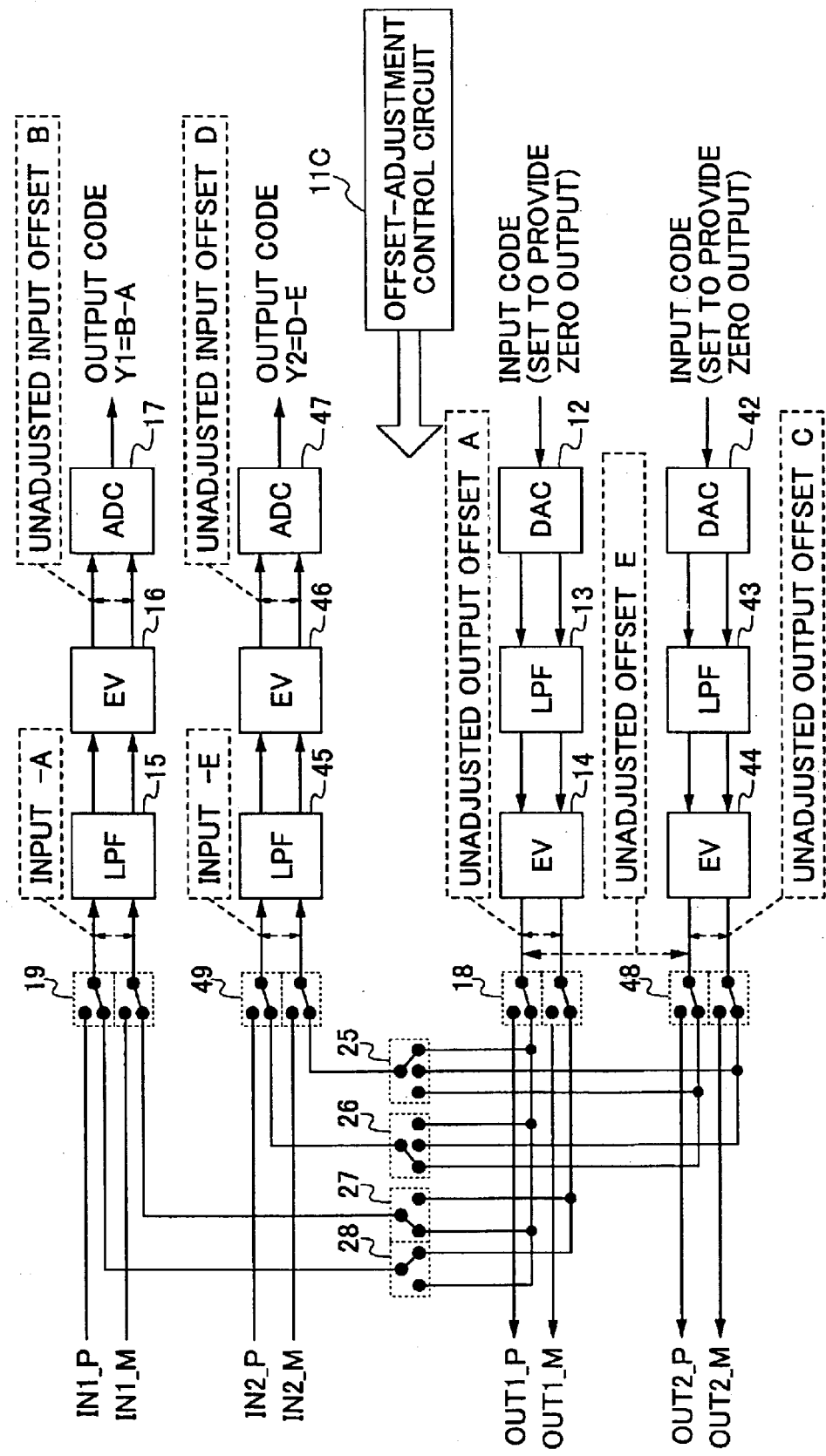
FIG. 12 is a block diagram showing the fourth embodiment of the digital-analog-conversion circuit, illustrating a second stage of the automatic offset adjustment sequence.
Figure 13:
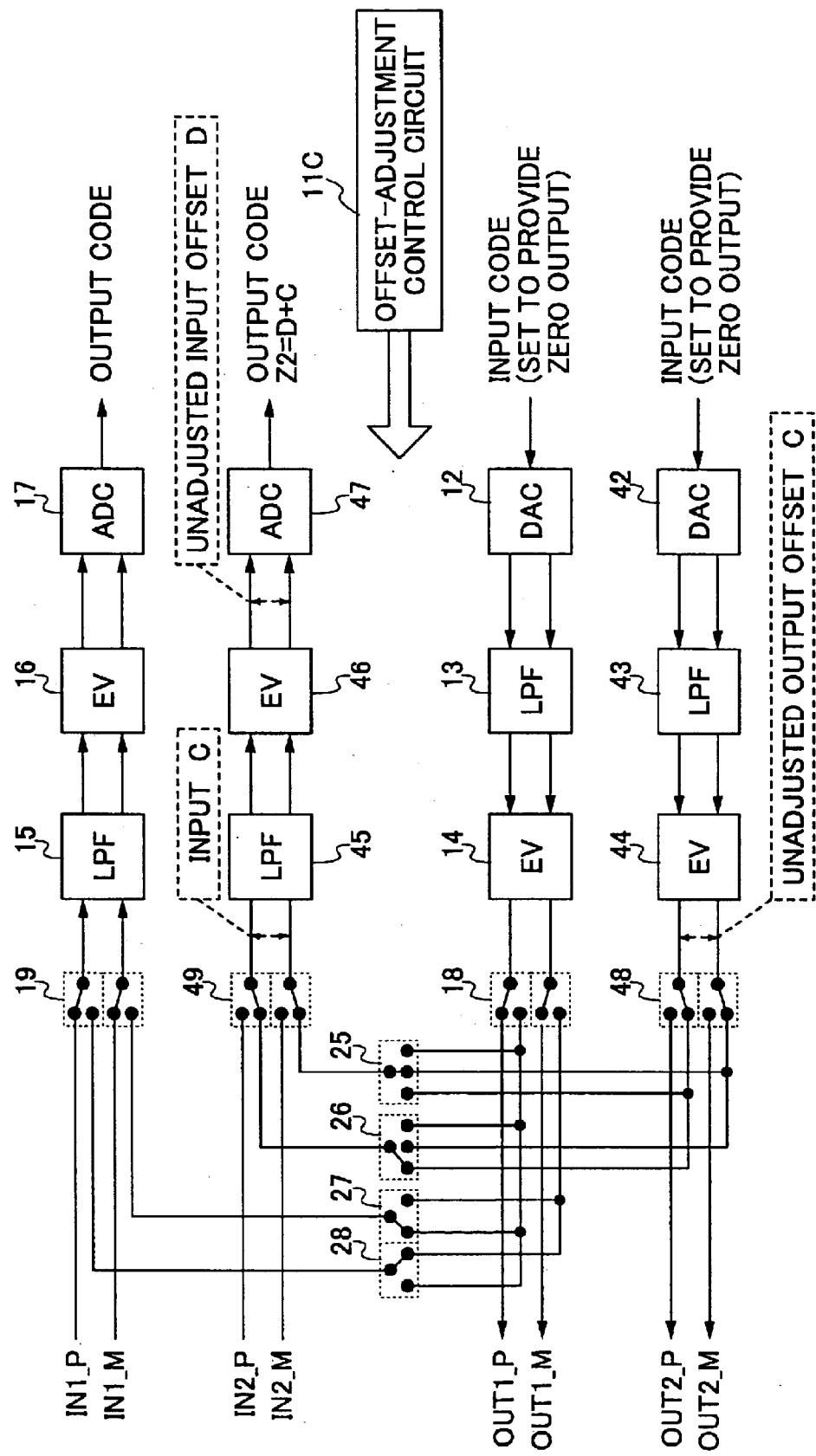
FIG. 13 is a block diagram showing the fourth embodiment of the digital-analog-conversion circuit, illustrating a third stage of the automatic offset adjustment sequence.

FIG. 11 through FIG. 13 are block diagrams showing a fourth embodiment of the digital-analog-conversion circuit according to the present invention. In FIG. 11 through FIG. 13, the same elements as those of FIG. 1 through FIG. 3 are referred to by the same numerals, and a description thereof will be omitted.

As shown in FIG. 11, the digital-analog-conversion circuit of the fourth embodiment includes two systems for the analog output unit and two systems for the analog input unit. The second path of the analog output unit includes a DAC 42, a low-pass filter 43, an electronic volume 44, and a switch circuit 48. The second path of the analog input unit includes a low-pass filter 45, an electronic volume 46, an ADC 47, and a switch circuit 49. Further, switch circuits 25 through 28 are provided. This embodiment is applicable to a transmission/reception system based on quadrature modulation, wherein the first path may correspond to the in-phase component and the second path may correspond to the quadrature components.

As shown in FIG. 11, the offset-adjustment control circuit 11C controls the switching of the switch circuits 18–19, 25–28, and 48–49 so as to couple the unadjusted output offset A of the first path of the analog output unit to the first path of the analog input unit, and to couple an unadjusted offset E appearing between the positive side of the first path of the analog output unit and the positive side of the second path of the analog output unit to the second path of the analog input unit. In this case, an output code X1 output from the ADC 17 is equal to B+A that is a sum of the unadjusted output offset A and an unadjusted input offset B of the first path of the analog input unit. Further, an output code X2 output from the ADC 47 is equal to D+E that is a sum of the unadjusted offset E and an unadjusted input offset D of the second path of the analog input unit.

Further, as shown in FIG. 12, the offset-adjustment control circuit 11C controls the switching of the switch circuits 18–19, 25–28, and 48–49 so as to couple an inverse of the unadjusted output offset A of the first path of the analog output unit to the first path of the analog input unit, and to couple an inverse of the unadjusted offset E appearing between the positive side of the first path of the analog output unit and the positive side of the second path of the analog output unit to the second path of the analog input unit. In this case, an output code Y1 output from the ADC 17 is equal to B−A that is a sum of the inverse −A of the unadjusted output offset and the unadjusted input offset B of the first path of the analog input unit. Further, an output code Y2 output from the ADC 47 is equal to D−E that is a sum of the inverse −E of the unadjusted offset and the unadjusted input offset D of the second path of the analog input unit.

Moreover, as shown in FIG. 13, the offset-adjustment control circuit 11C controls the switching of the switch circuits 18, 25–26, and 49 so as to couple an unadjusted output offset C of the second path of the analog output unit to the second path of the analog input unit. In this case, an output code Z2 output from the ADC 47 is equal to D+C that is a sum of the unadjusted output offset C and the unadjusted input offset D of the second path of the analog input unit.

Based on the output codes X1, X2, Y1, Y2, and Z2 obtained in the manner as described above, the offset-adjustment control circuit 11C obtains each offset as follows:

$A=(X1-Y1)/2;$ $B=(X1+Y1)/2;$ $C=Z2-(X2+Y2)/2;$ $D=(X2+Y2)/2;$ and $E=(X2-Y2)/2.$ The offsets as obtained in this manner are used as offset adjustment codes, thereby adjusting offsets of the analog output unit and the analog input unit in the similar manner as in the first through third embodiments.

In the fourth embodiment as described above, the analog output unit and the analog input unit are each provided with two systems of signal paths, wherein offset adjustment is performed with respect to each signal path, and an offset in existence between the first signal path and the second signal path is also adjusted.

Figure 14:
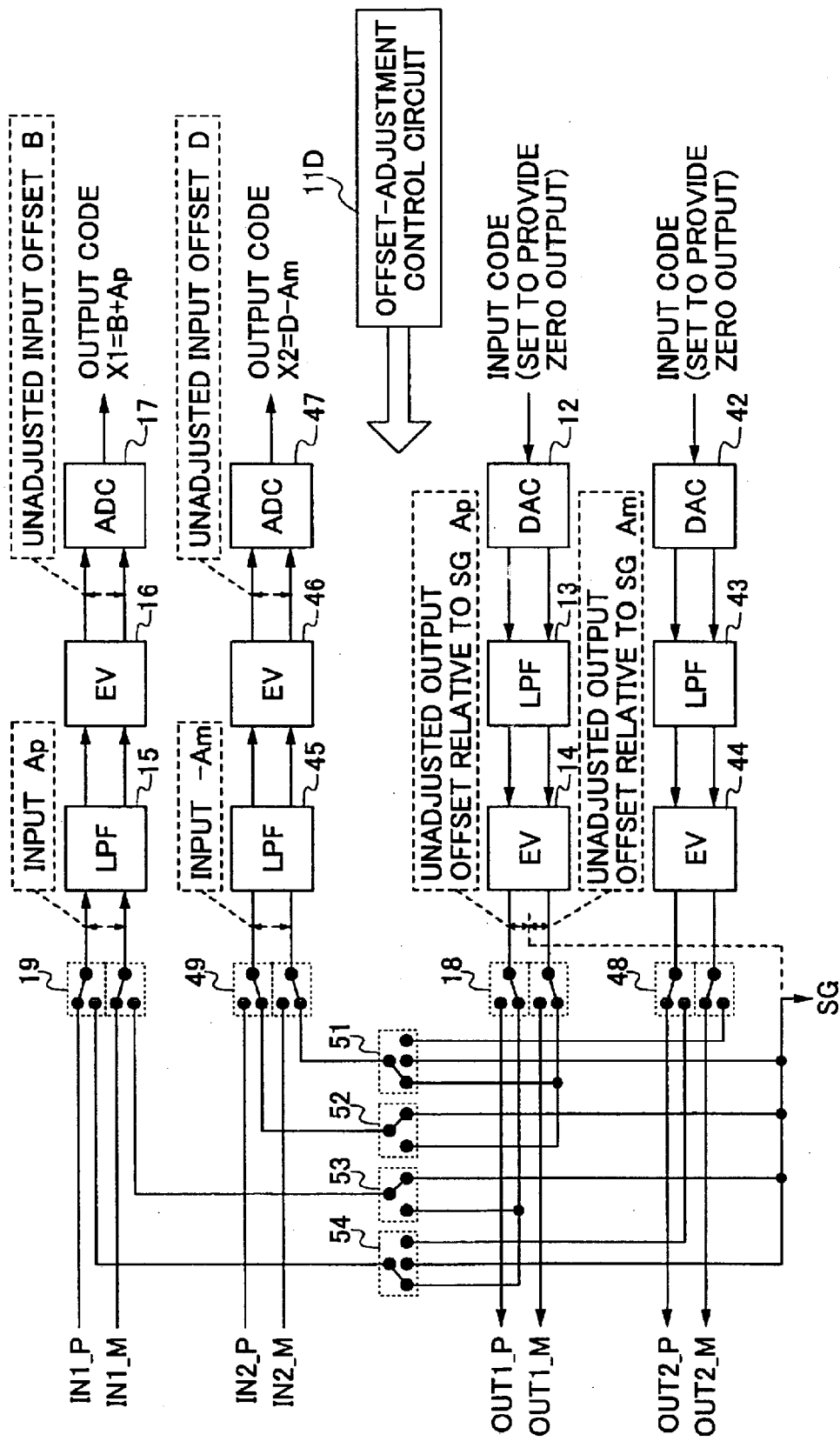
FIG. 14 is a block diagram showing a fifth embodiment of the digital-analog-conversion circuit according to the present invention, illustrating a first stage of an automatic offset adjustment sequence.
Figure 15:
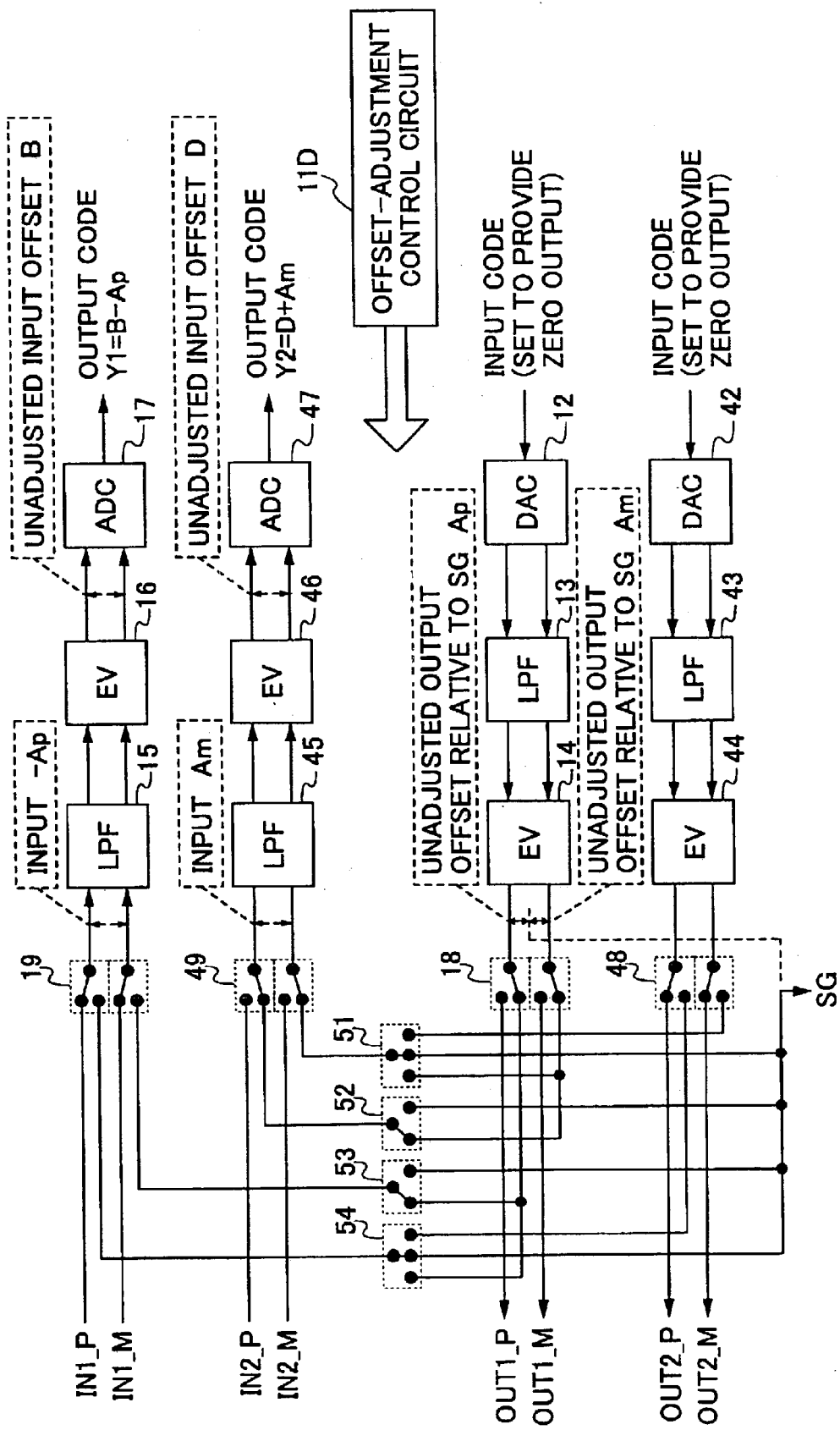
FIG. 15 is a block diagram showing the fifth embodiment of the digital-analog-conversion circuit, illustrating a second stage of the automatic offset adjustment sequence.
Figure 16:
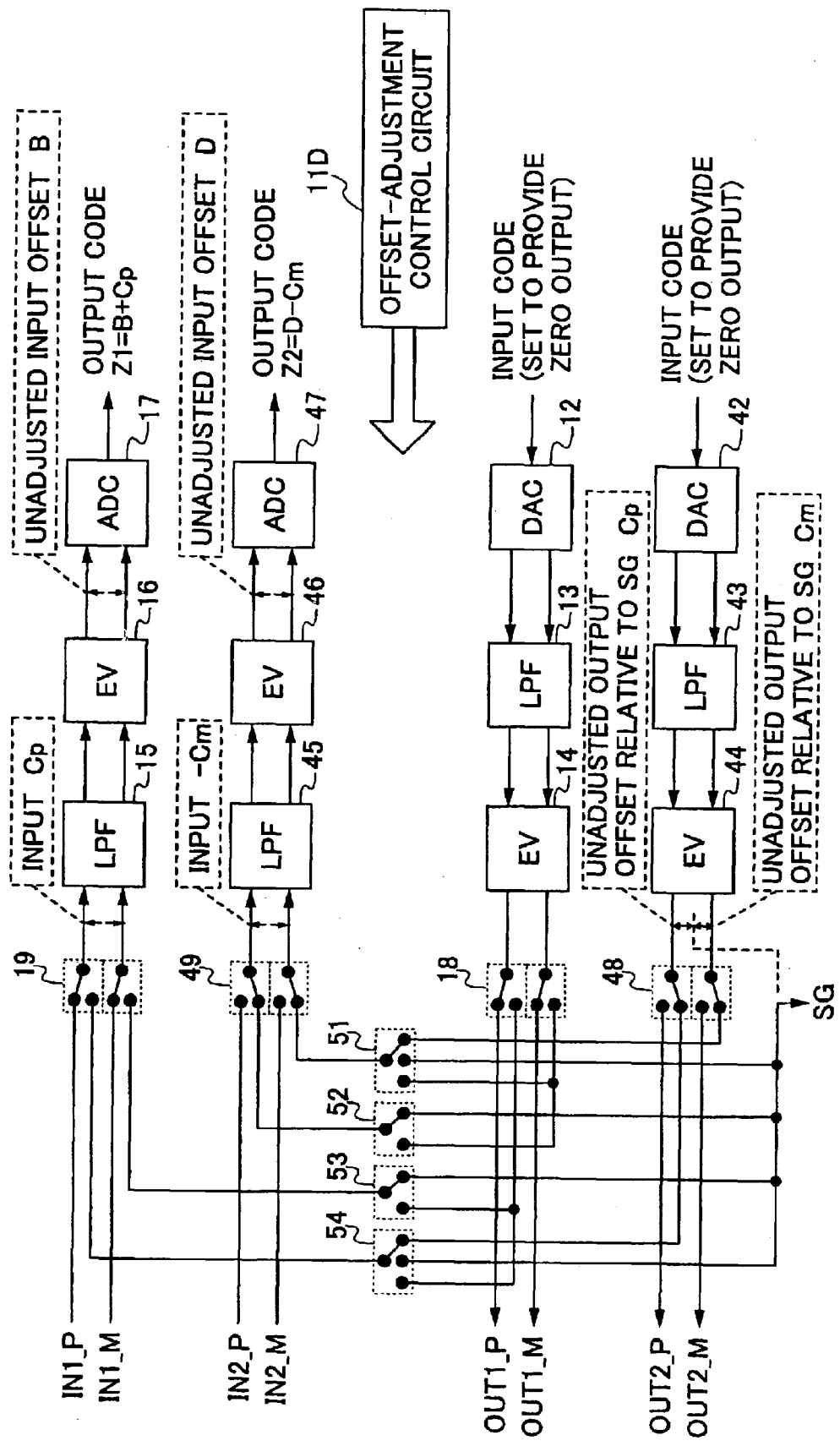
FIG. 16 is a block diagram showing the fifth embodiment of the digital-analog-conversion circuit, illustrating a third stage of the automatic offset adjustment sequence.

FIG. 14 through FIG. 16 are block diagrams showing a fifth embodiment of the digital-analog-conversion circuit according to the present invention. In FIG. 14 through FIG. 16, the same elements as those of FIG. 11 through FIG. 13 are referred to by the same numerals, and a description thereof will be omitted.

As shown in FIG. 14, the digital-analog-conversion circuit of the fifth embodiment includes two systems for the analog output unit and two systems for the analog input unit. This embodiment is applicable to a transmission/reception system based on quadrature modulation, wherein the first path may correspond to the in-phase component and the second path may correspond to the quadrature components. In a similar manner to the third embodiment shown in FIG. 7, an offset of the positive-side signal relative to the signal ground SG is denoted as a positive-side unadjusted output offset Ap in the first path of the analog output unit, and an offset of the negative-side signal relative to the signal ground SG is denoted as a negative-side unadjusted output offset Am.

As shown in FIG. 14, the offset-adjustment control circuit 11D controls the switching of the switch circuits 18–19, 48–49, and 51–54 so as to couple the positive-side unadjusted output offset Ap of the first path of the analog output unit to the first path of the analog input unit, and to couple an inverse of the negative-side unadjusted output offset Am of the first path of the analog output unit to the second path of the analog input unit. In this case, an output code X1 output from the ADC 17 is equal to B+Ap by adding the unadjusted input offset B of the first path of the analog input unit. Further, an output code X2 output from the ADC 47 is equal to D−Am by adding the unadjusted input offset D of the second path of the analog input unit.

Thereafter, as shown in FIG. 15, the offset-adjustment control circuit 11D controls the switching of the switch circuits 18–19, 48–49, and 51–54 so as to couple an inverse of the positive-side unadjusted output offset Ap of the first path of the analog output unit to the first path of the analog input unit, and to couple the negative-side unadjusted output offset Am of the first path of the analog output unit to the second path of the analog input unit. In this case, an output code Y1 output from the ADC 17 is equal to B−Ap by adding the unadjusted input offset B of the first path of the analog input unit. Further, an output code Y2 output from the ADC 47 is equal to D+Am by adding the unadjusted input offset D of the second path of the analog input unit.

Following this, as shown in FIG. 16, the offset-adjustment control circuit 11D controls the switching of the switch circuits 18–19, 48–49, and 51–54 so as to couple a positive-side unadjusted output offset Cp of the second path of the analog output unit to the first path of the analog input unit, and to couple an inverse of a negative-side unadjusted output offset Cm of the second path of the analog output unit to the second path of the analog input unit. In this case, an output code Z1 output from the ADC 17 is equal to B+Cp by adding the unadjusted input offset B of the first path of the analog input unit. Further, an output code Z2 output from the ADC 47 is equal to D−Cm by adding the unadjusted input offset D of the second path of the analog input unit.

Based on the output codes X1, X2, Y1, Y2, Z1, and Z2 obtained in the manner as described above, the offset-adjustment control circuit 11D obtains each offset as follows:

$Ap=(X1-Y1)/2;$ $Am=(Y2-X2)/2;$ $B=(X1+Y1)/2;$ $D=(X2+Y2)/2;$ $Cp=Z1-(X1+Y1)/2;$ $Cm=(X2+Y2)/2-Z2.$

The offsets as obtained in this manner are used as offset adjustment codes, thereby adjusting offsets of the analog output unit and the analog input unit in the similar manner as in the first through third embodiments.

In the fifth embodiment as described above, the analog output unit and the analog input unit are each provided with two systems of signal paths, wherein offset adjustment is performed with respect to each signal path by taking into account not only the reversed phase offset but also the in-phase offset.

Figure 17:
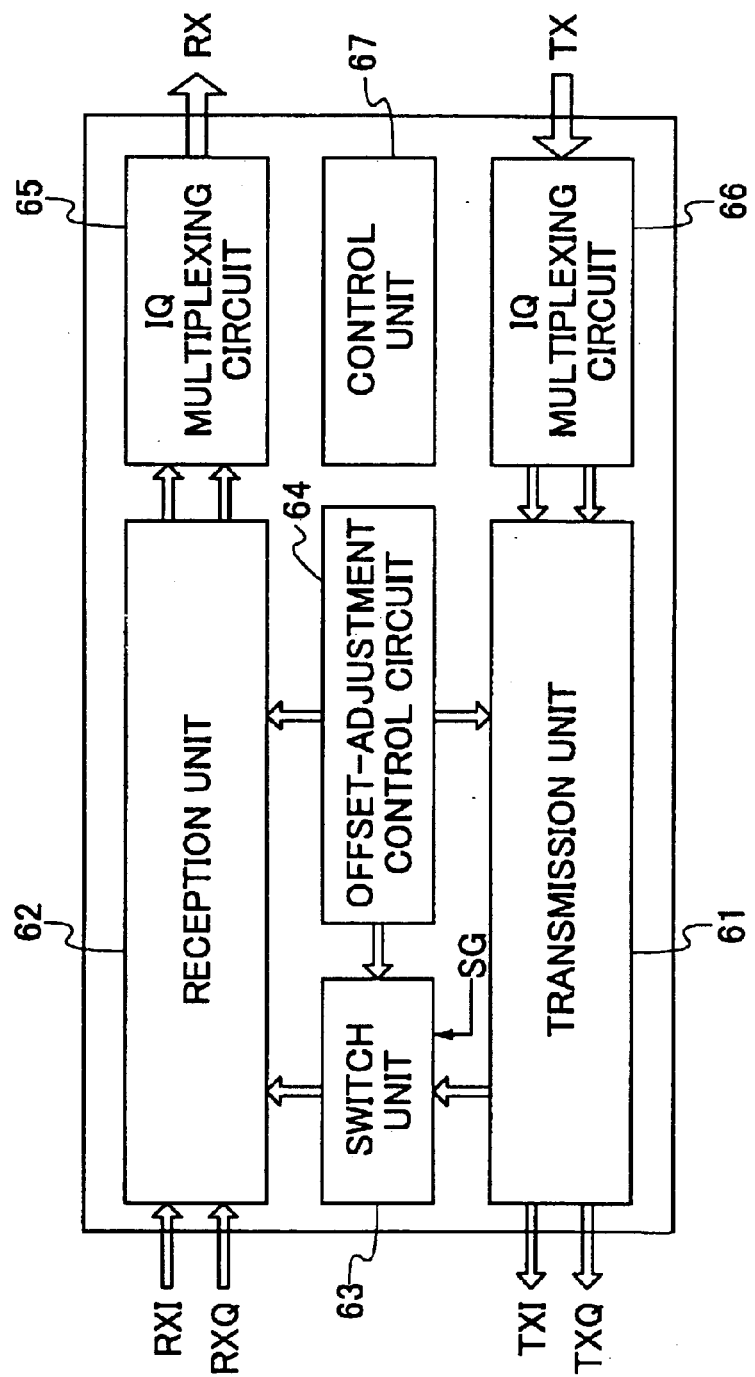
FIG. 17 is a block diagram showing a schematic construction of an analog-baseband LSI as an example of a transmission/reception-signal processing circuit.

FIG. 17 is a block diagram showing a schematic construction of an analog-baseband LSI (large scale integrated circuit) as an example of a transmission/reception-signal processing circuit.

The transmission/reception-signal processing circuit of FIG. 17 is used as an analog-baseband signal unit of a cellular phone, for example, and includes a transmission unit 61, a reception unit 62, a switch unit 63, an offset-adjustment control circuit 64, IQ multiplexing circuits 65 and 66, and a control unit 67. A transmission signal TX supplied to the IQ multiplexing circuit 66 is separated into an in-phase signal component I and a quadrature signal component Q, which are then supplied to the transmission unit 61. The transmission unit 61 corresponds to the analog output unit of the embodiments previously described. The transmission unit 61 converts the supplied signals from the digital form to the analog form, and directs them through low-pass filters and electronic volumes, followed by outputting an analog in-phase transmission signal TXI and an analog quadrature transmission signal TXQ to an exterior of the LSI. The reception unit 62 corresponds to the analog input unit of the embodiments previously described. The reception unit 62 receives an analog in-phase reception signal RXI and an analog quadrature reception signal RXQ, and direct them through lowpass filters and electronic volumes, followed by performing AD conversion on the received signals. An in-phase signal component I and a quadrature signal component Q are then supplied to the IQ multiplexing circuit 65. The IQ multiplexing circuit 65 multiplexes the in-phase signal component I and the quadrature signal component Q to output a reception signal RX. The control unit 67 controls operation timing and the like of the transmission/reception-signal processing circuit.

The switch unit 63 provides signal paths through which the analog output signals of the transmission unit 61 are supplied as input signals to the reception unit 62. These signal paths may include signal paths that direct differential signals without any change, signal paths that supplies an inverse of the differential signals, signal paths that supplies one of the differential signals and the signal ground SG, signal paths that supplies an offset appearing between the in-phase component I and the quadrature component Q, etc. The offset-adjustment control circuit 64 controls the switching of the switch unit 63, and adjusts the offsets of the transmission unit 61 and the reception unit 62 in response to the output and input offsets that are measured by utilizing the signal paths of the switch unit 63.

Further, the present invention is not limited to these embodiments, but various variations and modifications may be made without departing from the scope of the present invention.

What is claimed is:

1. An integrated circuit, comprising:
    an analog signal output unit which converts a digital output signal into at least one analog output signal, and outputs said at least one analog output signal;
    an analog signal input unit which converts at least one analog input signal received from an exterior into a digital input signal;
    a switch circuit which provides at least one signal path through which said at least one analog output signal is supplied from said analog signal output unit to said analog signal input unit as said at least one analog input signal; and
    an offset adjustment control circuit which supplies an output offset from said analog signal output unit to said analog signal input unit via said at least one signal path so as to detect the digital input signal inclusive of the output offset and an input offset, and cancels offsets of said analog signal output unit and said analog signal input unit on the basis of the output offset and the input offset obtained from the detected digital input signal.

2. The integrated circuit as claimed in claim 1, wherein said analog signal output unit includes:
    a DA conversion unit which converts the digital output signal into an analog signal;
    a first low-pass filter which has an input thereof coupled to an output of said DA conversion unit; and
    a first electronic volume which has an input thereof coupled to an output of said first low-pass filter, and outputs said at least one analog output signal,
    wherein said analog signal input unit includes:
    a second low-pass filter which receives said at least one analog input signal;
    a second electronic volume which has an input thereof coupled to an output of said second low-pass filter; and
    an AD conversion unit which has an input thereof coupled to an output of said second electronic volume, and outputs the digital input signal.

3. The integrated circuit as claimed in claim 2, wherein said offset adjustment control circuit measures the digital input signal obtained when the output offset from said analog signal output unit is supplied to said analog signal input unit via said at least one signal path, the digital input signal being measured a first time under a condition that said first electronic volume is set to a first volume and a second time under a condition that said first electronic volume is set to a second volume, wherein said offset adjustment control circuit obtains the output offset and the input offset from the measurements of the digital input signal.

4. The integrated circuit as claimed in claim 1, wherein each of said at least one analog output signal and said at least one analog input signal includes differential signals, and said switch circuit is configured to provide first signal paths that supply said at least one analog output signal as said at least one analog input signal without any change, and to provide second signal paths that supply an inverse of said at least one analog output signal as said at least one analog input signal, said offset adjustment control circuit obtaining the output offset and the input offset from the digital input signal detected by use of the first signal paths and the digital input signal detected by use of the second signal paths.

5. The integrated circuit as claimed in claim 1, wherein each of said at least one analog output signal and said at least one analog input signal includes differential signals, and said switch circuit is configured to provide a signal path that supplies a signal ground of the differential signals to said analog signal input unit.

6. The integrated circuit as claimed in claim 5, wherein said switch circuit is configured to provide first signal paths that supply the signal ground and one of the differential signals of said at least one analog output signal as said at least one analog input signal, and to provide second signal paths that supply, after inversion, the signal ground and said one of the differential signals of said at least one analog output signal as said at least one analog input signal, said offset adjustment control circuit obtaining the output offset and the input offset with respect to said one of the differential signals from the digital input signal detected by use of the first signal paths and the digital input signal detected by use of the second signal paths.

7. The integrated circuit as claimed in claim 1, wherein each of said analog signal output unit and said analog signal input unit includes a plurality of signal systems corresponding to respective signals, and said switch circuit is configured to provide signal paths that supply analog output signals from said analog signal output unit to said analog signal input unit as analog input signals with respect to each of the plurality of signal systems.

8. The integrated circuit as claimed in claim 7, wherein said switch circuit is configured to provide signal paths through which a signal of a first signal system and a signal of a second signal system among the plurality of signal systems of said analog signal output unit are supplied as differential signals to one of the plurality of signal systems of said analog signal input unit.

9. An integrated circuit, comprising:

an analog signal output unit which converts a digital output signal into at least one analog output signal;

an analog signal input unit which converts at least one analog input signal into a digital input signal; and a switch circuit which selects one of a first signal path, a second signal path, and a third signal path, the first signal path supplying said at least one analog output signal from said analog signal output unit to said analog signal input unit as said at least one analog input signal, the second signal path supplying an inverse of said at least one analog output signal from said analog signal output unit to said analog signal input unit as said at least one analog input signal, and the third signal path separating said at least one analog output signal of said analog signal output unit from said at least one analog input signal of said analog signal input unit such as to output said at least one analog output signal to an exterior and to receive said at least one analog input signal from the exterior.

10. The integrated circuit as claimed in claim 9, further comprising an offset adjustment control circuit which detects a first digital input signal by supplying an output offset from said analog signal output unit to said analog signal input unit via said first signal path, and detects a second digital input signal by supplying an inverse of the output offset from said analog signal output unit to said analog signal input unit via said second signal path, followed by obtaining an output offset of said analog signal output unit and an input offset of said analog signal input unit from the first digital input signal and the second digital input signal.

* * * * *